US010103318B2

(12) United States Patent
Watanabe et al.

(10) Patent No.: US 10,103,318 B2
(45) Date of Patent: Oct. 16, 2018

(54) MAGNETORESISTIVE ELEMENT

(71) Applicants: TOSHIBA MEMORY CORPORATION, Minato-ku, Tokyo (JP); SK HYNIX INC., Icheon-si, Gyeonggi-do (KR)

(72) Inventors: Daisuke Watanabe, Seoul (KR); Yang Kon Kim, Incheon-si (KR); Makoto Nagamine, Seoul (KR); Youngmin Eeh, Seongnam-si (KR); Koji Ueda, Seoul (KR); Toshihiko Nagase, Seoul (KR); Kazuya Sawada, Seoul (KR); Guk Cheon Kim, Yeoju-si (KR); Bo Mi Lee, Suwon-si (KR); Won Joon Choi, Seoul (KR)

(73) Assignees: TOSHIBA MEMORY CORPORATION, Tokyo (JP); SK HYNIX, INC., Icheon-si, Gyeonggi-Do (KR)

( * ) Notice: Subject to any disclaimer, the term of this patent is extended or adjusted under 35 U.S.C. 154(b) by 0 days.

(21) Appl. No.: 15/262,821

(22) Filed: Sep. 12, 2016

(65) Prior Publication Data
US 2016/0380182 A1    Dec. 29, 2016

Related U.S. Application Data

(63) Continuation of application No. PCT/JP2014/069125, filed on Jul. 14, 2014.
(Continued)

(51) Int. Cl.
*H01L 43/02* (2006.01)
*H01L 43/08* (2006.01)
(Continued)

(52) U.S. Cl.
CPC ............ *H01L 43/02* (2013.01); *H01L 27/228* (2013.01); *H01L 43/08* (2013.01); *H01L 43/10* (2013.01); *H01L 43/12* (2013.01)

(58) Field of Classification Search
CPC ......... H01L 43/02; H01L 43/04; H01L 43/08; H01L 43/10; H01L 43/12
See application file for complete search history.

(56) References Cited

U.S. PATENT DOCUMENTS

| 2005/0184839 A1 | 8/2005 | Nguyen et al. |
| 2007/0159734 A1 | 7/2007 | Nguyen et al. |

(Continued)

FOREIGN PATENT DOCUMENTS

| CN | 101202325 A | 6/2008 |
| JP | 2008147522 A | 6/2008 |

(Continued)

OTHER PUBLICATIONS

International Search Report (ISR) and Written Opinion dated Oct. 21, 2014 issued in International Application No. PCT/JP2014/069125.

(Continued)

*Primary Examiner* — Cuong Q Nguyen
(74) *Attorney, Agent, or Firm* — Holtz, Holtz & Volek PC

(57) ABSTRACT

According to one embodiment, there is provided a magnetoresistive element, including a first magnetic layer, a nonmagnetic layer on the first magnetic layer, and a second magnetic layer on the nonmagnetic layer, wherein one of the first and second magnetic layers include one of Co and Fe, and a material having a higher standard electrode potential than Co and Fe.

13 Claims, 7 Drawing Sheets

Related U.S. Application Data

(60) Provisional application No. 61/952,815, filed on Mar. 13, 2014.

(51) Int. Cl.
   *H01L 43/10* (2006.01)
   *H01L 27/22* (2006.01)
   *H01L 43/12* (2006.01)

(56) References Cited

U.S. PATENT DOCUMENTS

| | | |
|---|---|---|
| 2008/0140922 A1 | 6/2008 | Higo et al. |
| 2013/0163317 A1* | 6/2013 | Yamane .................. G11C 7/04 |
| | | 365/158 |

FOREIGN PATENT DOCUMENTS

| | | |
|---|---|---|
| JP | 2012104848 A | 5/2012 |
| TW | 200830314 A | 7/2008 |

OTHER PUBLICATIONS

Taiwanese Office Action dated Jan. 26, 2016 issued in counterpart Taiwanese Application No. 103131026.

Hitoshi Kubota, et al., "Reduction in switching current using a low-saturation magnetization Co—Fe—(Cr, V)—B free layer in MgO-based magnetic tunnel junctions", Journal of Applied Physics, 105, (2009), pp. 07D117-1 to 07D117-3.

* cited by examiner

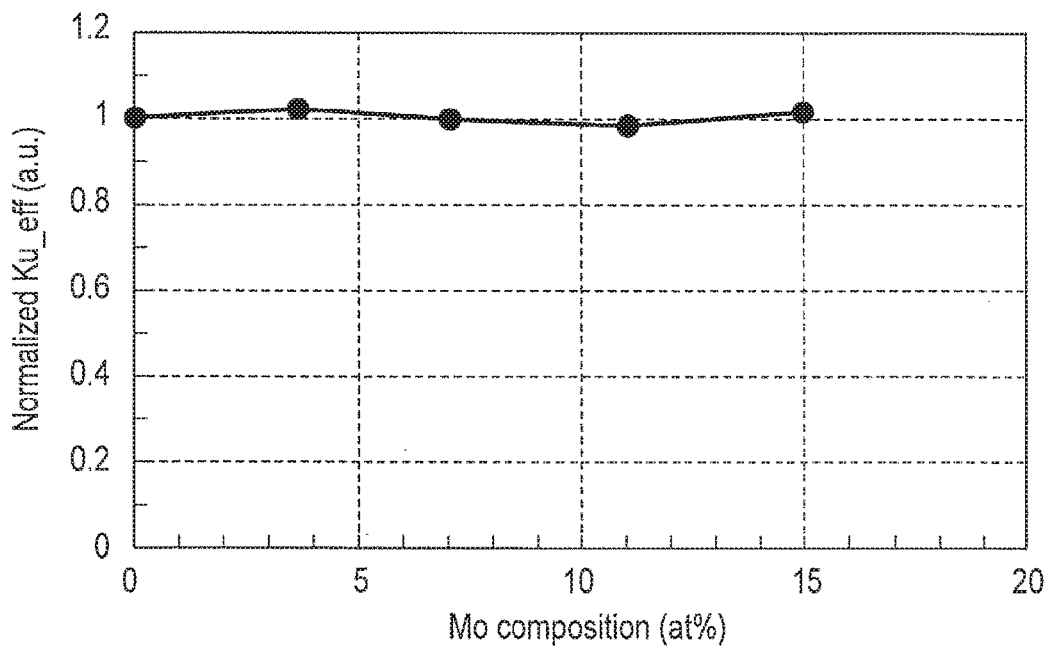
F I G. 5
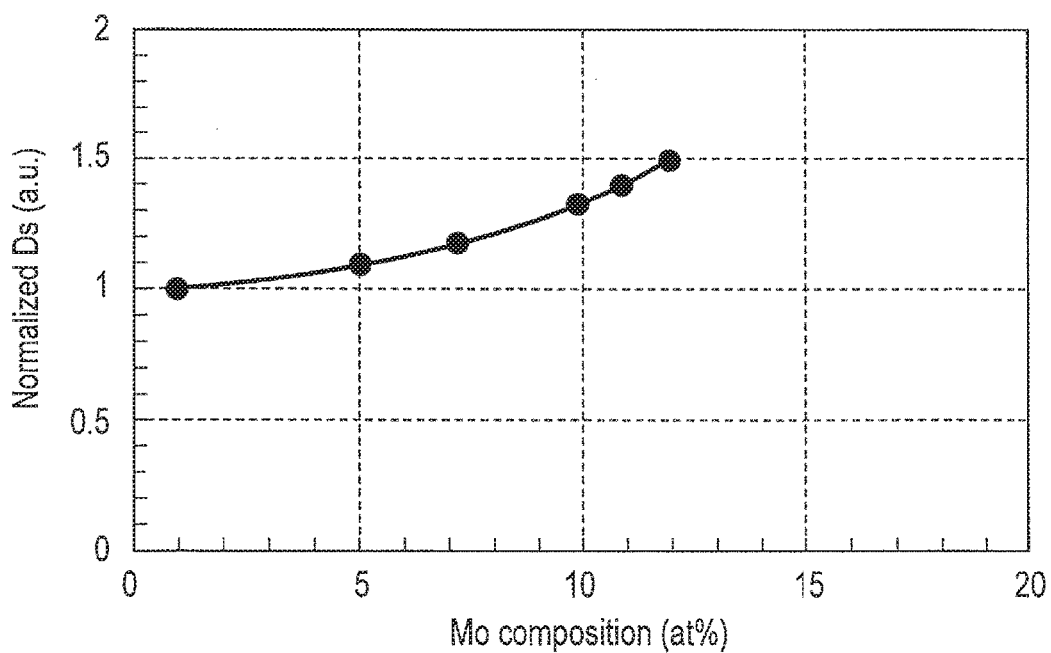
F I G. 6

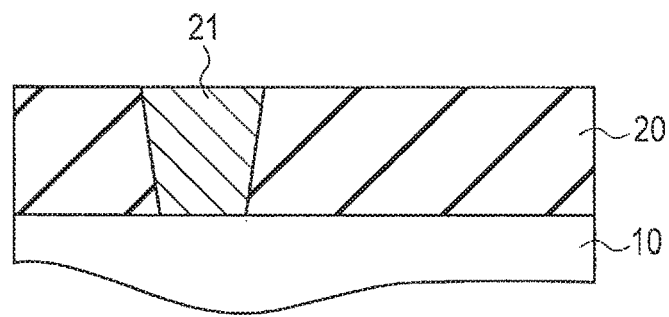
F I G. 9A
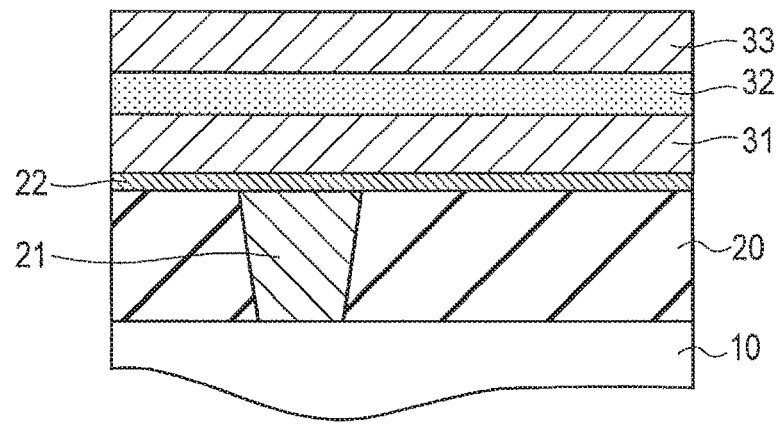
F I G. 9B
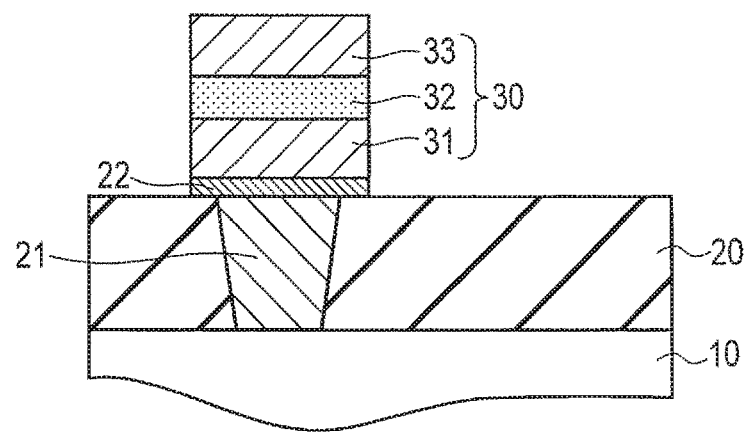
F I G. 9C

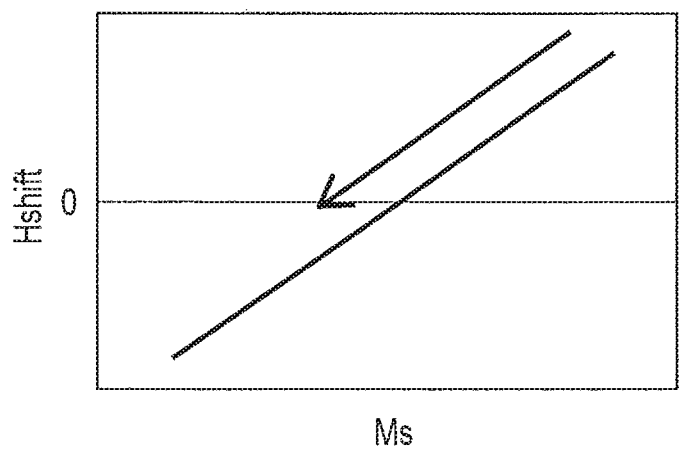
F I G. 12
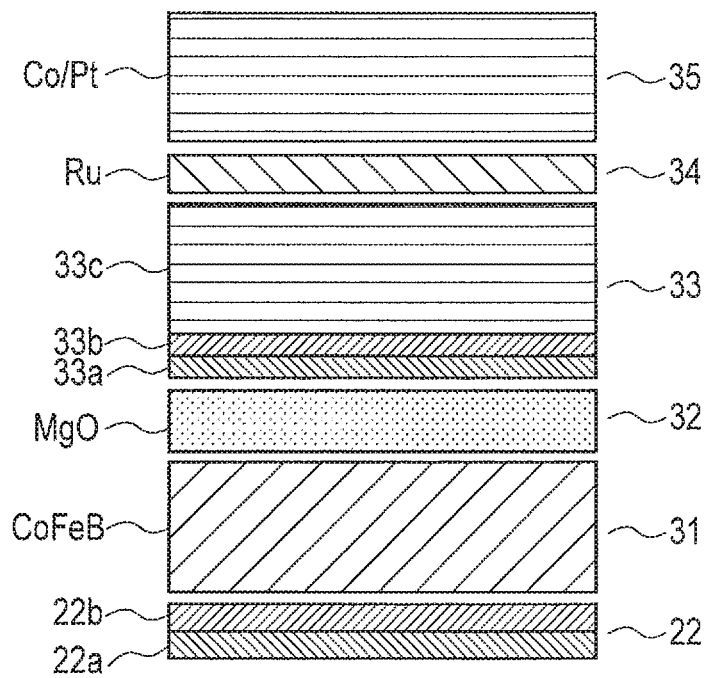
F I G. 13

US 10,103,318 B2

MAGNETORESISTIVE ELEMENT

CROSS-REFERENCE TO RELATED APPLICATIONS

This application is a Continuation Application of PCT Application No. PCT/JP2014/069125, filed Jul. 14, 2014 and based upon and claiming the benefit of priority from U.S. Provisional Application No. 61/952,815, filed Mar. 13, 2014, the entire contents of all of which are incorporated herein by reference.

FIELD

Embodiments described herein relate generally to a magnetoresistive element.

BACKGROUND

Recently, a large-capacity magnetoresistive random access memory (MRAM) using a magnetic tunnel junction (MTJ) element has been expected and attracted attention. In the MTJ element used in the MRAM, one of two ferromagnetic layers sandwiching a tunnel barrier layer is handled as a magnetization-fixed layer (reference layer) having a magnetizing direction fixed not to be easily varied, and the other is handled as a magnetization free layer (storage layer) having an invertible magnetizing direction.

BRIEF DESCRIPTION OF THE DRAWINGS

FIG. 5 is a characteristic diagram showing a relationship between a magnetic anisotropy constant Ku and the Mo composition in the storage layer of the magnetoresistive element.

FIG. 6 is a characteristic diagram showing a relationship between a diameter Ds of an activated portion and the Mo composition in the storage layer of the magnetoresistive element.

FIGS. 9A to 9C are cross-sectional views showing manufacturing steps of the memory cell module shown in FIG. 8.

FIG. 12 is a characteristic diagram showing a relationship between an No composition in a storage layer and a shift amount in a shift cancelling layer.

FIG. 13 is a cross-sectional view showing a more concrete constitution of the magnetoresistive element shown in FIG. 10.

DETAILED DESCRIPTION

In general, according to one embodiment, there is provided a magnetoresistive element, comprising: a first magnetic layer; a nonmagnetic layer on the first magnetic layer; and a second magnetic layer on the nonmagnetic layer, wherein one of the first and second magnetic layers include one of Co and Fe, and a material having a higher standard electrode potential than Co and Fe.

Embodiments will be described hereinafter with reference to the accompanying drawings.

(First Embodiment)

[Constitution of Magnetoresistive Element]

Figure 1:
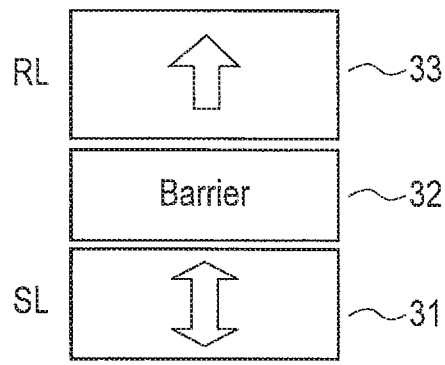
FIG. 1 is a cross-sectional view showing a basic constitution of a magnetoresistive element of a first embodiment.

FIG. 1 is a cross-sectional view showing a basic constitution of a magnetoresistive element or a first embodiment.

A tunnel barrier layer (nonmagnetic layer) 32 formed of MgO is sandwiched between a storage layer (first magnetic layer) 31 (SL) formed of CoFeB and a reference layer (second magnetic layer) 33 (RL) formed of CoFeB.

In such an MTJ element, information can be stored by associating a parallel state and an antiparallel state of the magnetizing directions of the storage layer 31 and the reference layer 33 with binary numbers "0" and "1". When the magnetization directions of the storage layer 31 and the reference layer 33 are parallel to each other, a resistance (barrier resistance) of the tunnel barrier layer 32 is smaller and a tunnel current is greater as compared with those when the magnetization directions are antiparallel. The MR ratio is [(resistance in the antiparallel state—resistance in the parallel, state)/resistance in the parallel state]. Memory information is read by detecting a resistance variation based on a TMR effect. Thus, a greater resistance variation rate (MR ratio) based on the TMR effect is preferable at the reading. In addition, a thermal stability index $\Delta$ of the storage layer 31 needs to be greater to implement stable memory maintenance in the MTJ element.

Figure 2:
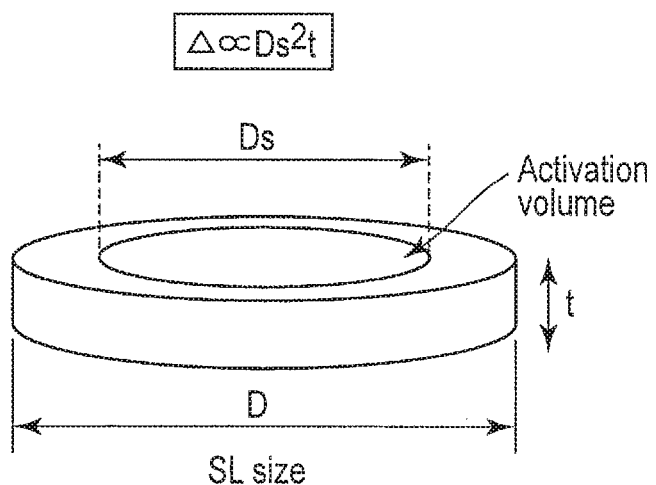
FIG. 2 is a schematic drawing for explanation of an activation volume in a storage layer of the magnetoresistive element.

The thermal stability index $\Delta$ depends on an activation area ($\pi Ds^2/4$) and a thickness t of the storage layer 31 as shown in FIG. 2. Accordingly, an activation volume may be increased to increase the thermal stability index $\Delta$. In FIG. 2, D represents a diameter of the storage layer 31 and Ds represents a diameter of the activated portion of the storage layer 31.

According to calculation, the activation volume is increased as a saturation magnetization Ms of the storage layer 31 is reduced. Thus, reduction of the saturation magnetization Ms is considered to cause increase of the thermal stability index $\Delta$. Mixing a nonmagnetic material with CoFeB of the constituent material of the storage layer 31 is effective to lower the saturation magnetization Ms.

As seen in prior art, however, if Cr or V is mixed. with CoFeB, the saturation magnetization Ms is certainly lower but a perpendicular magnetic anisotropy (PMA) necessary for the thermal stability index $\Delta$ and the MR ratio necessary for reading are deteriorated.

The present embodiment solves the above-described problem by selecting the nonmagnetic material mixed with CoFeB. In other words, the present embodiment succeeds lowering of the saturation magnetization Ms alone without reducing the perpendicular magnetic anisotropy (PMA) or the MR ratio.

Figure 3:
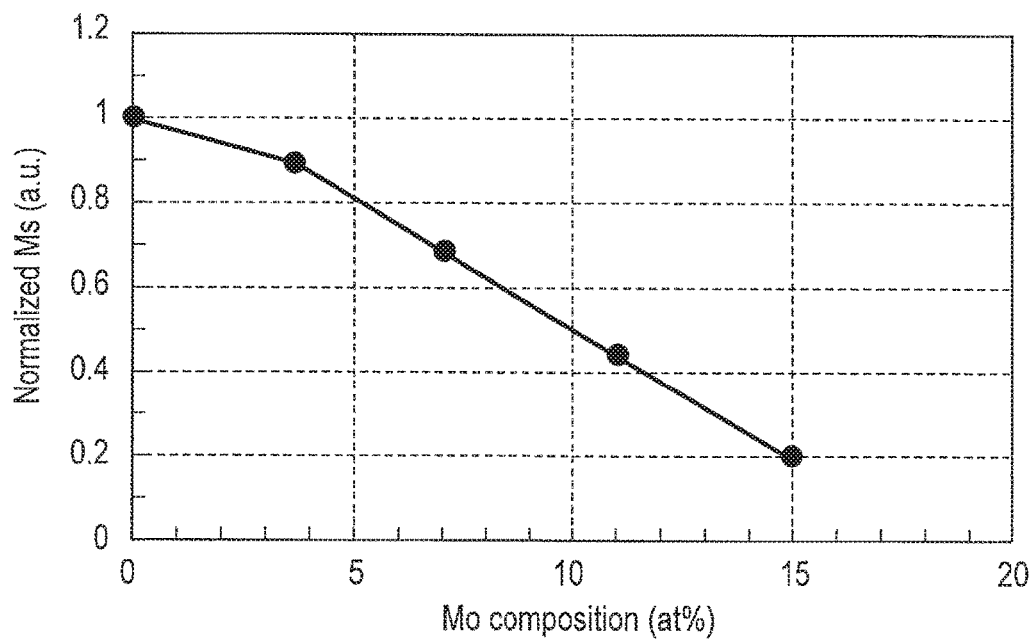
FIG. 3 is a characteristic diagram showing a relationship between a saturation magnetization Ms and a Mo composition in the storage layer of the magnetoresistive element.
Figure 4:
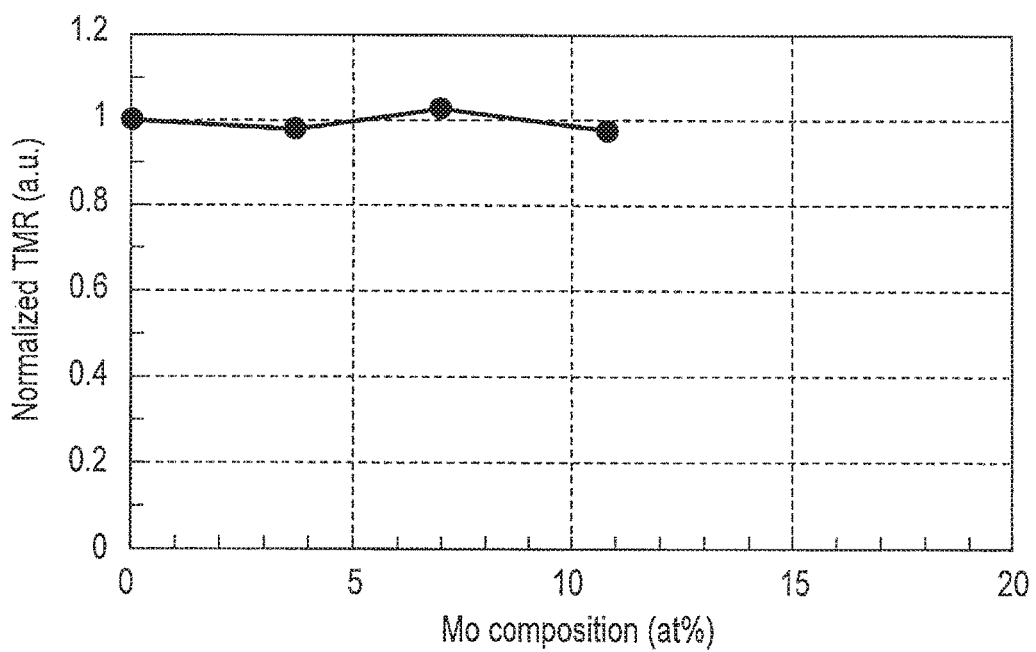
FIG. 4 is a characteristic diagram showing a relationship between an MR ratio and the Mo composition in the storage layer of the magnetoresistive element.

FIG. 3 is a characteristic diagram showing a relationship between the saturation magnetization Ms and a Mo composition in the storage layer 31. The saturation magnetization Ms is lowered as the Mo composition becomes higher. This point is applied to a case where Cr or V is mixed with CoFeB as seen in prior art. In FIG. 3, a vertical axis indicates a value standardized as 1 when the Mo composition is 0 at %. In FIG. 4 to FIG. 6, too, the vertical axis indicates a value standardized in the same manner.

FIG. 4 is a characteristic diagram showing a relationship between the MR ratio and the Mo composition in the storage layer 31. Even if the Mo composition becomes higher, the MR ratio is not lowered but remains substantially constant. As seen in prior art, when Cr or V is mixed with CoFeB, the MR ratio is reduced as the Mo composition becomes higher. In other words, a characteristic of lowering the saturation magnetization Ms without lowering the MR ratio, which cannot be seen in prior art, can be achieved by mixing Mo with CoFeB, similarly to the present embodiment.

FIG. 5 is a characteristic diagram showing a parameter Ku of the perpendicular magnetic anisotropy. Even if the Mo composition of the storage layer 31 becomes higher, Ku is not lowered but remains substantially constant. As seen in prior art, when Cr or V is mixed with CoFeB, Ku is reduced as the Mo composition becomes higher. If the perpendicular magnetic anisotropy of the storage layer 31 is lowered, in-plane magnetization occurs and the MTJ element cannot be utilized. In other words, a characteristic of lowering the saturation magnetization Ms without lowering the perpendicular magnetic anisotropy, which cannot be seen in prior art, can be achieved by mixing Mo with CoFeB, similarly to the present embodiment.

FIG. 6 is a characteristic diagram showing a relationship between the diameter Ds of the activated portion and the Mo composition in the storage layer 31. This characteristic has been derived by calculation. Ds becomes greater as the Mo composition becomes higher. It can be understood from this characteristic that the thermal stability index $\Delta$ is increased by making the Mo composition higher.

Each of FIG. 3 to FIG. 6 shows data obtained when B composition in CoFeB is 20 at %. If the B composition is different, these characteristics are also varied, but the basic tendency is the same. In other words, if the B composition is varied, the characteristic curve in each drawing is slightly shifted in a vertical so direction and the degree of inclination is merely varied slightly. Accordingly, the above-described phenomenon occurs irrespective of the B composition.

Thus, according to the present embodiment, the saturated magnetization Ms can be reduced without lowering the MR ratio or Ku by mixing nonmagnetic Mo with CoFeB that is the constituent material of the storage layer 31. The thermal stability index $\Delta$ can be increased without reducing the MR ratio. This effect is extremely advantageous when the magnetoresistive element is employed as a memory cell of the MRAM.

The constituent material of the storage layer 31 is not limited to CoFeB, but may contain ferromagnetic Co and Fe. An effect like the above-described effect can also be obtained by mixing Mo with CoFe. The reason why nonmagnetic B is contained in ferromagnetic CoFe is that the storage layer 31 can be easily crystallized by annealing executed after formation of the storage layer 31. It is therefore desirable that the storage layer 31 is formed of CoFeB containing an appropriate amount of B, rather than CoFe.

The Mo composition in the storage layer 31 may be arbitrarily determined in accordance with the required characteristic. If the Mo composition is so low, the effect of increasing the thermal stability index $\Delta$ can hardly be recognized. If the Mo composition is so high, the saturated magnetization Ms becomes so lower. Accordingly, the Mo composition is desirably in a range 1 to 30 at %. In addition, the desirable range of the Mo composition is also varied according to the B composition. Furthermore, B is nonmagnetic. If the B composition is so high, the saturated magnetization Ms becomes so low, similarly to the case of Mo. It is therefore desirable that the total composition of Mo and B is in a range of 1 to 30 at %.

In addition, the same effect can also be obtained by using W instead of Mo as the nonmagnetic material mixed with the storage layer 31. The reason is presumed to be that since a material having the high standard electrode potential does not diffuse to the MgO side which is the tunnel barrier, an interface between MgO and CoFeB becomes preferable and lattice mismatching hardly occurs. The same effect is therefore expected to be obtained by using a material having a higher standard electrode material than Co or Fe as the nonmagnetic material mixed with the storage layer 31 of CoFeB.

Mo may be mixed with not only the storage layer 31, but also CoFeB that is the constituent material of the reference layer 33. In this case, an effect that a sputtering target common to the storage layer and the reference layer can be used can be obtained.

[Application to MRAM]

Figure 7:
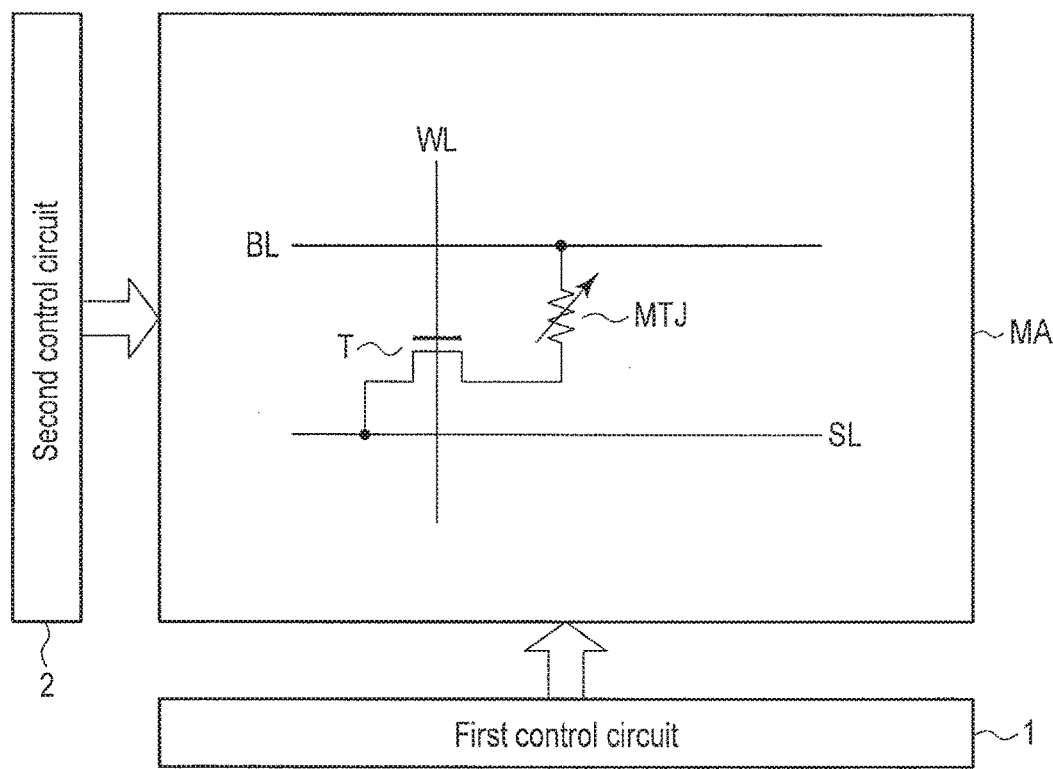
FIG. 7 is a circuit configuration diagram showing an MRAM using the magnetoresistive element of the first embodiment.

FIG. 7 is a circuit diagram showing a memory cell array of MRAM using the magnetoresistive element of the present embodiment.

A memory cell in the memory cell array MA comprises a serial connection body of the MTJ element serving as the magnetoresistive element and a switching element (for example, a field effect transistor (FET)) T. One of ends of the serial connection body (i.e. one of ends of the MTJ element) is electrically connected. to a bit line BL and the other end of the serial connection body (i.e. one of ends of the switching element T) is electrically connected to a source line SL.

A control terminal of the switching element T, for example, a gate electrode of the FET is electrically connected to a word line WL. An electric potential of the word line WL is controlled by a first control circuit 1. Electric potentials of the bit line BL and the source line SL are connected to a second control circuit 2.

Figure 8:
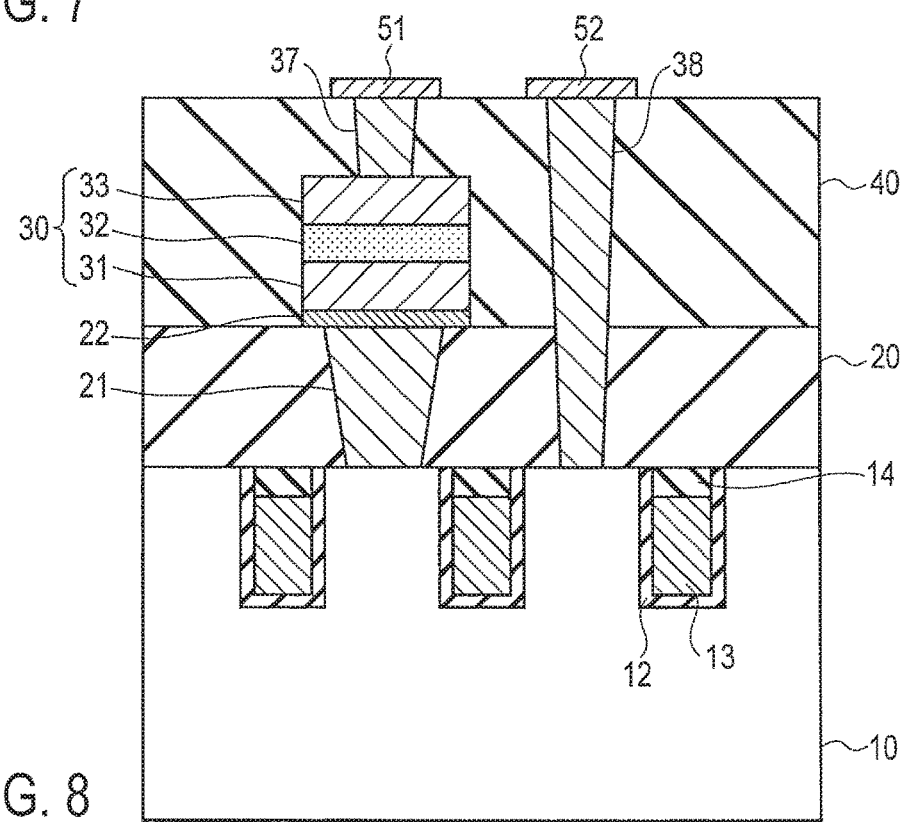
FIG. 8 is a cross-sectional view showing an element structure of a memory cell module in the MRAM shown in FIG. 7.

FIG. 8 is a cross-sectional view showing a structure of a memory cell module using the magnetoresistive element of the present embodiment.

A switching MOS transistor is formed on a surface of a Si substrate 10 and an interlayer insulating film 20 is formed on the transistor. The transistor has an embedded gate structure in which a gate electrode 13 is embedded in a groove formed in the substrate 10 via a gate insulation film 12. The gate electrode 13 is embedded in the middle of the groove, and a protective insulation film 14 is formed on the gate electrode 13. In addition, source and drain regions (not shown) are formed on both sides of the embedded gate structure, by diffusing p-type or n-type impurity in the substrate 10.

The constitution of the transistor module is not limited to a transistor module comprising the embedded gate structure. For example, the gate electrode may be formed on the surface of the Si substrate 10 via the gate insulation film. The transistor module may be constituted to function as a switching element.

In the interlayer insulating film 20, a contact hole through which connection with the drain of the transistor is made is formed, and a lower electrode (BEC) 21 is embedded in the contact hole. The lower electrode 21 is formed of a metal having crystallinity which is, for example, Ta.

On the lower electrode 21, a buffer layer 22 formed of Hf is formed. The material of the buffer layer is not limited to Hf, but may contain any of Ta, Zn, Cr, Nb, V, Mn, Zr, Pa, Hf, Ti, Al, Be, Th, Sc, Nd, Cd, Tb, Lu, Dy, N, Mo, TiN, AlN and HfN.

A CoFeB film serving as the ferromagnetic storage layer 31, an MgO film serving as the tunnel barrier layer 32, and a CoFeB film serving as the ferromagnetic reference layer 33 are stacked on the buffer layer 22. In other words, the MTJ element 30 formed by sandwiching the tunnel barrier layer 31 between the two ferromagnetic layers 31 and 33 is constituted. As described above, the storage layer 31 of the MTJ element 30 contains approximately 10 at % of Mo.

An interlayer insulation film 40 is formed on the substrate on which the MTJ element 30 is formed. A contact plug (TEC) 37 connected with the reference layer 33 of the MTJ element 30 is embedded in the interlayer insulation film 40. In addition, a contact plug 38 connected to the source of the transistor module is embedded through the interlayer insulation film 40 and the interlayer insulation film 20. A wiring line (BL) 51 connected to the contact plug 37 and a wiring line (SL) 52 connected to a contact plug 38 are formed on the interlayer insulation film 40.

Next, a method of manufacturing the memory cell module of the present embodiment will be described with reference to FIG. 9A to FIG. 9C.

First, a switching MOS transistor (not shown) having the embedded gate structure is formed on a surface portion of the Si substrate 10, and the interlayer insulation film 20 of $SiO_2$, etc. is deposited on the Si substrate 10 by CVD, as shown in FIG. 9A. Then, a contact hole to make connection with the drain of the transistor is formed in the interlayer insulation film 20, and the lower electrode 21 formed of crystalline Ta is embedded in the contact hole. More specifically, the Ta film is deposited on interlayer insulation film 20 by the spattering, etc. to embed the contact hole, and the Ta film is left in the contact hole alone by removing the Ta film on the interlayer insulation film by the chemical mechanical etching (CMP).

Next, the buffer layer 22 is formed on the interlayer insulation film 20 and the lower electrode 21 by the spattering, etc. as shown in FIG. 9B. The CoFeB film which is to serve as the ferromagnetic storage layer 31, the MgO film which is to serve as the tunnel barrier layer 32, and the CoFeB film which is to serve as the ferromagnetic reference layer 33 are sequentially deposited on the buffer layer 22. In other words, the layered structure for formation of the MTJ element in which the nonmagnetic tunnel barrier layer is sandwiched between the ferromagnetic layers is formed.

When the storage layer 31 is formed, a target formed by mixing approximately 10 at % of Mc with CoFeB is used, and a CoFeB+Mo film is deposited by spattering the target. Similarly, when the tunnel barrier 32 is formed, the MgO film is deposited by spattering the MgO target. Similarly, when the reference layer 33 is formed, the CoFeB film is deposited by spattering the CoFeB target. B is reduced while Mo is substantially left, in a heating step for crystallizing CoFeB. B may not be contained finally.

Next, the MTJ element 30 is formed by processing the layered portions 22, 31, 32 and 33 in a cell pattern as shown in FIG. 9C. More specifically, a cell pattern mask is formed on the reference layer 33, and the layered portions are subjected to selective etching by RIE, etc. so as to be left in an insular shape on the lower electrode 21.

After that, the interlayer insulation film 40 is formed, then the contact plugs 37 and 38 are formed, and the wiring lines 51 and 52 are further formed. The constitution shown in FIG. 8 can be thereby obtained.

Thus, according to the present embodiment, the MTJ element 30 serving as the memory cell can be formed on the substrate on which the switching transistor is formed, and the memory cell can be formed in a small area. In this case, since Mo is mixed with the CoFeB storage layer 31 of the MTJ element 30, the saturated magnetization Ms can be reduced without lowering the MR ratio or Ku of the storage layer 31. For this reason, the thermal stability index $\Delta$ can be made great without reducing the MR ratio. Accordingly, stable maintenance of memory in the storage layer 31 can be implemented and the reliability of the MRM can be increased.

(Second Embodiment)

Figure 10:
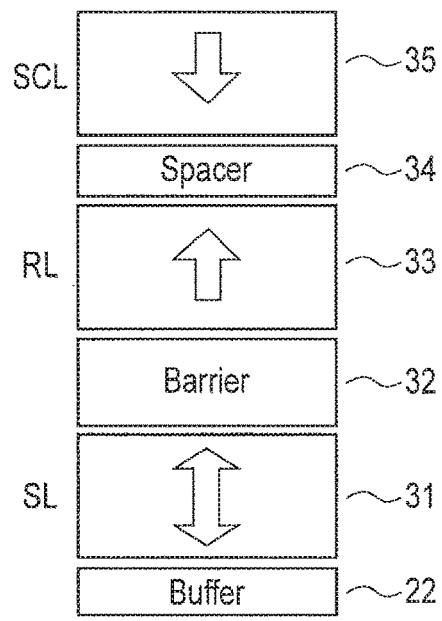
FIG. 10 is a cross-sectional view showing a basic constitution of a magnetoresistive element of a second embodiment.

FIG. 10 is a cross-sectional view showing a basic constitution of a magnetoresistive element of a second embodiment. Elements like or similar to those shown in FIG. 1 and FIG. 8 are denoted by similar reference numbers and are not described in detail here.

A CoFeB storage layer (first magnetic layer) 31 (SL), an MgO tunnel barrier (first nonmagnetic layer) 32, a CoFeB reference layer (second magnetic layer) 33 (RL), a Ru spacer layer 34, and a Co/Pt shift cancelling layer (third magnetic layer) 35 (SCL) are formed on a buffer layer (base layer) 22. The present embodiment is characterized by mixing Mo with the reference layer 33.

Figure 11:
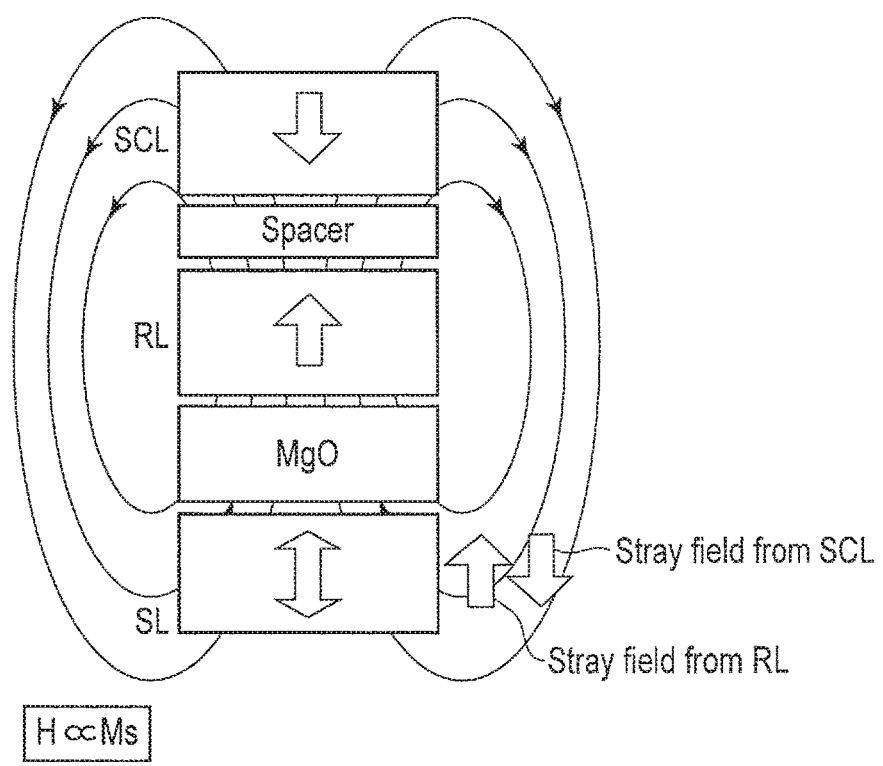
FIG. 11 is a schematic drawing for describing a cancellation effect of a stray magnetic field caused by a shift cancelling layer.

A role of the shift cancelling layer 35 is to cancel a stray magnetic field H from the reference layer 33, in a stray magnetic field from the cancelling layer 35, as shown in FIG. 11. The stray magnetic field H is proportional to saturated magnetization Ms. Accordingly, the saturated magnetization Ms of the reference layer 33 may have to be lowered to make the stray magnetic field H from the reference layer 33.

In the present embodiment, the saturated magnetization Ms of the reference layer 33 can be made small by mixing Mo with the reference layer 33. Since the shift amount in the shift cancelling layer 35 is proportional to the saturated magnetization Ms of the reference layer 33, the shift amount is reduced as the saturated magnetization Ms becomes small as shown in FIG. 12. Accordingly, by mixing Mo with the reference layer 33, the shift amount can be reduced and the thickness of the shift cancelling layer 35 can be thereby thinned. This brings about a merit of facilitating processing of the shift cancelling layer 35 and the layered portions including the shift cancelling layer 35.

In the present embodiment, too, the saturated magnetization Ms can be reduced without lowering the MR ratio or Ku as shown in FIG. 3 to FIG. 6, by mixing Mo with CoFeB of the storage layer 31. Therefore, an effect like the effect of the first embodiment can be obtained.

FIG. 13 is a cross-sectional view showing a more concrete constitution of the magnetoresistive element. The base layer 22 is a stack of a layer 22a (any of Ta, Zn, Cr, Nb, V, Mn, Zr, Pa, Hf, Ti, Al, Be, Th, Sc, Nd, Gd, Tb, Lu, Dy, W, Mo, TIN, AlN and HfN) and a layer 22b (any of AlN, ZrN, NbN and SiN). The storage layer 31 is a magnetic layer (containing Co or Fe). The reference layer 33 has a layered structure of artificial lattice of a magnetic layer (containing Co or Fe) 33a, a nonmagnetic layer (for example, Ta, Zr, Nb, Mo, Ru, Ti, V, Cr, N, Hf, Pt, Pd, Rh and Ir) 33b, and a magnetic layer (Co/Pt or Co/Pd) 33c. The spacer layer 34 is a nonmagnetic layer (for example, Ta, Zr, Nb, Mo, Ru, Ti, V, Cr, W, Hf, Pt, Pd, Rh and Ir). In addition, the shift cancelling layer 35 is an artificial lattice formed by stacking Co/Pt or Co/Pd.

In the reference layer 33, a behavior at a portion in contact with the MgO tunnel barrier layer 32 is particularly important. In FIG. 13, the port of the reference layer 33 in contact with the tunnel barrier layer 32 is, for example, CoFeB containing Co or Fe. The present embodiment can be therefore applied to the present constitution.

(Modified Embodiment)

The invention is not limited to the above-described embodiments.

Mixing Mo with any of the storage layer or the reference layer has been mainly described in the embodiments, but Mo may be mixed with both the storage layer and the reference layer. As for the storage layer, the mixture amount may be determined from the viewpoint of making the thermal stability index Δ great without reducing the MR ratio. As for the reference layer, the mixture amount may be determined from the viewpoint of reducing the stray magnetic field. Accordingly, the mixture amounts of Mo in the storage layer and the reference layer may be different from each other. For example, in the storage layer and the reference layer, the Mo composition in the layer in which the perpendicular magnetic anisotropy needs to be higher may be lower than the Mo composition in the other layer. This is because oxygen in MgO moves to an interface between the layer having the lower Mo composition and the MgO tunnel barrier layer due to the standard electrode potential and the perpendicular magnetic anisotropy of the layer having the lower Mo composition becomes great.

In addition, the Mo composition in the magnetic layer does not need to be constant and the composition may be distributed in the thickness direction. For example, the lattice mismatching of MgO and CoFeB hardly occurs by lowering the Mo composition at the MgO interface side. The Mo composition may be higher at a portion farther from MgO.

The nonmagnetic material mixed with the storage layer or the reference layer is not limited to Mo, but W can be used. Furthermore, the nonmagnetic material are not limited to Mo or W, but any material having a higher standard electrode potential than Co and Fe that are the constituent materials of the storage layer can be used as the nonmagnetic material. For example, Re, Ru, Rh, Os, Ir, etc. can also be used.

In addition, the materials of the buffer layer and the spacer layer are not limited to those of the embodiments, but can be arbitrarily changed in accordance with specifications. Moreover, the material of the lower electrode is not limited to Ta, but any material having a sufficient conductivity and allowing the lower electrode to be embedded in the contact hole may be used. W, TiN or Cu can be used besides Ta, as the material of the lower electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element, comprising:
a first magnetic layer;
a nonmagnetic layer provided above the first magnetic layer; and
a second magnetic layer provided above the nonmagnetic layer,
wherein each of the first and second magnetic layers includes (i) one of Co and Fe, and (ii) a material having a higher standard electrode potential than Co and Fe, and
wherein a composition of the material having the higher standard electrode potential in the first magnetic layer is different from a composition of the material having the higher standard electrode potential in the second magnetic layer.

2. The element of claim 1, wherein the material having the higher standard electrode potential is Mo or W.

3. The element of claim 1, wherein the first magnetic layer is a storage layer, the second magnetic layer is a reference layer, and the nonmagnetic layer is a tunnel barrier layer.

4. The element of claim 1, wherein each of the first and second magnetic layers further contains B.

5. The element of claim 4, wherein a total composition of B and the material having the higher standard electrode potential is 1 to 30 at %.

6. The element of claim 3, wherein the tunnel barrier layer is MgO.

7. A magnetoresistive element, comprising:
a first magnetic layer;
a first nonmagnetic layer provided above the first magnetic layer;
a second magnetic layer provided above the first nonmagnetic layer;
a second nonmagnetic layer provided above the second magnetic layer; and
a third magnetic layer provided above the second nonmagnetic layer,
wherein each of the first and second magnetic layers includes (i) one of Co and Fe, and (ii) a material having a higher standard electrode potential than Co and Fe, and
wherein a composition of the material having the higher standard electrode potential in the first magnetic layer is different from a composition of the material having the higher standard electrode potential in the second magnetic layer.

8. The element of claim 7, wherein the material having the higher standard electrode potential is Mo or W.

9. The element of claim 7, wherein the first magnetic layer is a storage layer, the first nonmagnetic layer is a tunnel barrier layer, the second magnetic layer is a reference layer, the second nonmagnetic layer is a spacer layer, and the third magnetic layer is a shift cancelling layer.

10. The element of claim 7, wherein each of the first and second magnetic layers further contains B.

11. The element of claim 10, wherein a total composition of B and the material having the higher standard electrode potential is 1 to 30 at %.

12. A magnetoresistive element, comprising:
a first magnetic layer;
a first nonmagnetic layer provided above the first magnetic layer;
a second magnetic layer provided above the first nonmagnetic layer;
a second nonmagnetic layer provided above the second magnetic layer; and
a third magnetic layer provided above the second nonmagnetic layer, wherein each of the first and second magnetic layers includes (i) one of Co and Fe, and (ii) a material having a higher standard electrode potential than Co and Fe, wherein the material having the higher standard electrode potential is Mo or W, wherein the first magnetic layer is a storage layer, the first nonmagnetic layer is a tunnel barrier layer, the second magnetic layer is a reference layer, the second nonmagnetic layer is a spacer layer, and the third magnetic layer is a shift cancelling layer, and wherein the tunnel barrier layer is MgO and the spacer layer is Ru.

13. A magnetoresistive element, comprising:

a first magnetic layer;

a first nonmagnetic layer provided above the first magnetic layer;

a second magnetic layer provided above the first nonmagnetic layer;

a second nonmagnetic layer provided above the second magnetic layer; and a third magnetic layer provided above the second nonmagnetic layer, wherein each of the first and second magnetic layers includes (i) one of Co and Fe, and (ii) a material having a higher standard electrode potential than Co and Fe, wherein the material having the higher standard electrode potential is Mo or W, wherein the first magnetic layer is a storage layer, the first nonmagnetic layer is a tunnel barrier layer, the second magnetic layer is a reference layer, the second nonmagnetic layer is a spacer layer, and the third magnetic layer is a shift cancelling layer, and wherein the shift cancelling layer has a lattice layer structure in which a magnetic material film and a nonmagnetic material film are layered.

* * * * *